(12) United States Patent
Drewes et al.

(10) Patent No.: US 7,947,597 B2
(45) Date of Patent: May 24, 2011

(54) METHODS OF TITANIUM DEPOSITION (75) Inventors: Joel A. Drewes, Longmont, CO (US);
Cem Basceri, Reston, VA (US);
Demetrius Sarigiannis, Medina, OH (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/720,562

(22) Filed: Mar. 9, 2010

(65) Prior Publication Data

US 2010/0167542 A1      Jul. 1, 2010

Related U.S. Application Data

(63) Continuation of application No. 11/741,113, filed on Apr. 27, 2007, now Pat. No. 7,700,480.

(51) Int. Cl.
*H01L 21/4763* (2006.01)
(52) U.S. Cl. ........ 438/648; 438/656; 438/664; 438/683; 438/685; 438/913
(58) Field of Classification Search .............. 438/648, 438/649, 655, 656, 664, 682, 683, 685, 913, 438/FOR. 352, FOR. 360
See application file for complete search history.

(56) References Cited

U.S. PATENT DOCUMENTS

| | | | |
|---|---|---|---|
| 5,924,009 | A | 7/1999 | Park |
| 5,977,636 | A | 11/1999 | Sharan |
| 6,071,562 | A | 6/2000 | Hornback et al. |
| 6,271,136 | B1 | 8/2001 | Shue et al. |
| 6,977,225 | B2 | 12/2005 | Iyer et al. |
| 2002/0168468 | A1 | 11/2002 | Chou et al. |
| 2005/0145897 | A1 | 7/2005 | Matsuo et al. |
| 2006/0113615 | A1 | 6/2006 | Lee et al. |
| 2006/0141152 | A1 | 6/2006 | Oh |
| 2006/0261479 | A1 | 11/2006 | Marsh |
| 2006/0292871 | A1 | 12/2006 | Goswami et al. |
| 2007/0020923 | A1 | 1/2007 | Kraus et al. |
| 2008/0001993 | A1 | 1/2008 | Cornell et al. |
| 2008/0193649 | A1 | 8/2008 | Jacquet et al. |
| 2008/0254376 | A1 | 10/2008 | Lin et al. |
| 2009/0004098 | A1 | 1/2009 | Schmidt et al. |
| 2009/0184281 | A1 | 7/2009 | Yadav et al. |

*Primary Examiner* — N Drew Richards
*Assistant Examiner* — Joannie A Garcia
(74) *Attorney, Agent, or Firm* — Wells St. John P.S.

(57) ABSTRACT

Some embodiments include methods of titanium deposition in which a silicon-containing surface and an electrically insulative surface are both exposed to titanium-containing material, and in which such exposure forms titanium silicide from the silicon-containing surface while not depositing titanium onto the electrically insulative surface. The embodiments may include atomic layer deposition processes, and may include a hydrogen pre-treatment of the silicon-containing surfaces to activate the surfaces for reaction with the titanium-containing material. Some embodiments include methods of titanium deposition in which a semiconductor material surface and an electrically insulative surface are both exposed to titanium-containing material, and in which a titanium-containing film is uniformly deposited across both surfaces.

10 Claims, 9 Drawing Sheets

_Fig. 1_

_Fig. 2_

METHODS OF TITANIUM DEPOSITION

This patent resulted from a continuation of U.S. patent application Ser. No. 11/741,113, which was filed Apr. 27, 2007, and which is hereby incorporated herein by reference.

TECHNICAL FIELD

Methods of titanium deposition.

BACKGROUND

Integrated circuit fabrication frequently includes formation of conductive materials directly against semiconductor materials. Example semiconductor materials are silicon and germanium.

Semiconductor materials may be considered part of semiconductor substrates. To aid in interpretation of this disclosure, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon; with an example semiconductive wafer being a monocrystalline silicon wafer), and semiconductive material layers (either alone or in assemblies comprising other materials; with an example semiconductive material layer being a layer of polysilicon). The term "substrate" refers to any supporting structure, including, but not limited to, the semiconductive substrates described above.

Integrated circuitry may include conductively-doped regions of semiconductor material. Such regions may be n-type doped or p-type doped. Electrical interconnects may be formed to electrically contact the conductively-doped regions.

One method of forming an electrical interconnect to a conductively-doped region is to form titanium silicide directly against the semiconductor material of the region, to form a metal nitride cap over the titanium silicide to protect the titanium silicide from oxidation, and to then form a conductive pedestal in electrical contact with the electrically conductive metal nitride cap. The metal nitride cap may comprise, for example, titanium nitride.

If the semiconductor material comprises silicon, the titanium silicide may be formed by depositing titanium directly against the silicon, and then reacting the titanium with the silicon to form titanium silicide.

The deposition of the titanium may be conducted on a substrate having some regions where titanium is desired to be deposited, and other regions where titanium deposition is not desired. For instance, the substrate may comprise electrically insulative regions (for instance, silicon dioxide regions or silicon nitride regions) in addition to the semiconductor regions, and it may be desired to form the titanium on the semiconductor regions but not on the insulative regions. It is difficult to form the titanium only over desired regions, and accordingly it is desired to develop improved processing for titanium deposition.

In addition to applications in which it is desired to deposit titanium selectively over one surface relative to another, there are also applications in which it is desired to form titanium-containing films uniformly across numerous surfaces of differing compositions. For instance, it may be desired to form a wiring layer extending across a conductively-doped region of semiconductor material, and also across insulative material surfaces adjacent the conductively-doped region. It can be difficult to form titanium-containing materials uniformly across semiconductor surfaces and insulative material surfaces, and accordingly it is desired to develop improved processing for titanium deposition that can be suitable for such applications.

DETAILED DESCRIPTION OF THE ILLUSTRATED EMBODIMENTS

In some embodiments a titanium film is grown on an exposed semiconductor surface (for instance, a surface consisting of one or more of silicon, conductively-doped silicon, germanium and conductively-doped germanium), selectively relative to exposed insulative material surfaces (for instance, exposed silicon dioxide, silicon nitride, or silicon oxynitride surfaces). In other embodiments, a titanium film is grown uniformly across both semiconductor surfaces and insulative material surfaces.

An example process which may be utilized to form a titanium film selectively on an exposed semiconductor surface relative to an exposed insulative material surface is a 3-step process utilizing hydrogen activation of the semiconductor surface, a purge of hydrogen remaining from the hydrogen activation, and a pulse of titanium-containing material to faun a titanium-containing film across the semiconductor surface.

An example process which may be utilized to form a titanium film uniformly across both a semiconductor surface and an insulative material surface is a 2-step process utilizing hydrogen activation of the semiconductor surface followed by exposure of the semiconductor and insulative surfaces to a mixture of hydrogen-containing material and titanium-containing material.

The 2-step and 3-step processes may be generically considered to be titanium-deposition processes which utilize flow of both titanium-containing material and hydrogen-containing material into a chamber. The hydrogen-containing material and titanium-containing material may be flowed sequentially relative to one another into a reaction chamber, and/or may be flowed simultaneously into the reaction chamber depending on whether the 2-step process is being utilized or the 3-step process is being utilized, and depending on the particular embodiment of the 2-step process or 3-step process being utilized.

Figure 1:
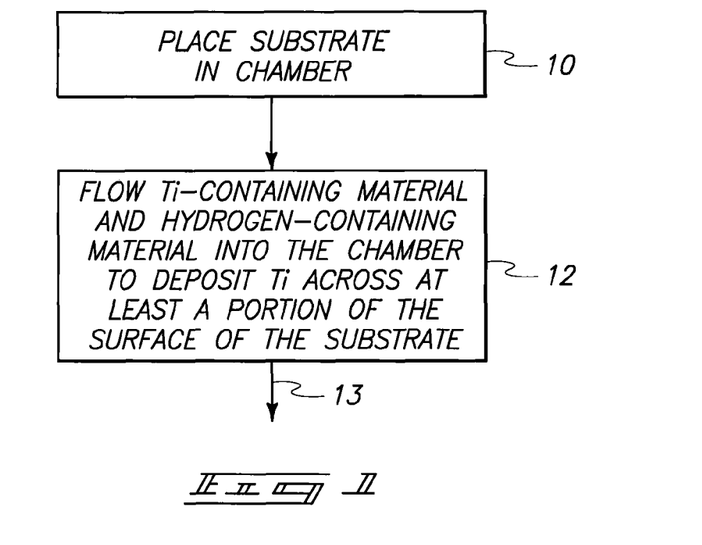
FIG. 1 is flow chart diagram of an embodiment.

FIG. 1 is a flow chart diagrammatically illustrating a process flow generic to the 2-step and 3-step processes. The flow begins with a step 10 of placing a substrate in a reaction chamber. The substrate may comprise an exposed surface containing a region of a semiconductor material, and also containing a region of an insulative material. The semiconductor material may, for example, comprise, consist essentially of, or consist of one or both of silicon and germanium; and the insulative material may, for example, comprise, consist essentially of, or consist of one or more of various oxides (for instance, silicon dioxide, aluminum oxide, hafnium oxide, etc.), nitrides (for instance, silicon nitride), and oxynitrides (for instance, silicon oxynitride).

The next step of the FIG. 1 process is a step 12 of flowing titanium-containing material and hydrogen-containing material into the chamber to deposit titanium (Ti) across at least a portion of the exposed surface of the substrate. As discussed previously, the titanium-containing material and hydrogen-containing material may be flowed into the chamber sequentially relative to one another, or simultaneously. The process would continue after flowing the titanium-containing material and hydrogen-containing material into the chamber, as indicated by arrow 13. Such continuation of the process may involve multiple cycles of the flowing of the titanium-containing material and hydrogen-containing material into the chamber to form a titanium-containing layer to a desired thickness, and/or may comprise removal of the substrate from the chamber.

The hydrogen-containing material may be any suitable material and may, for example, comprise, consist essentially of, or consist of one or more of $H_2$, organic materials, or hydrocarbons (for instance, methane, ethane, ethylene, etc.); and the titanium-containing material may be any suitable material, and may for example, comprise, consist essentially of, or consist of one or more of $TiCl_4$, tetrakis-dimethylamino-titanium (TDMAT), and tetrakis-diethylamido-titanium (TDEAT).

If the titanium-containing material is an organometallic material (for instance, TDMAT or TDEAT), any hydrogen-containing material introduced into chamber with the titanium-containing material may be solely from the organic component of the organometallic material.

Either or both of the hydrogen-containing material and titanium-containing material may be utilized together with plasma in the reaction chamber.

Figure 4:
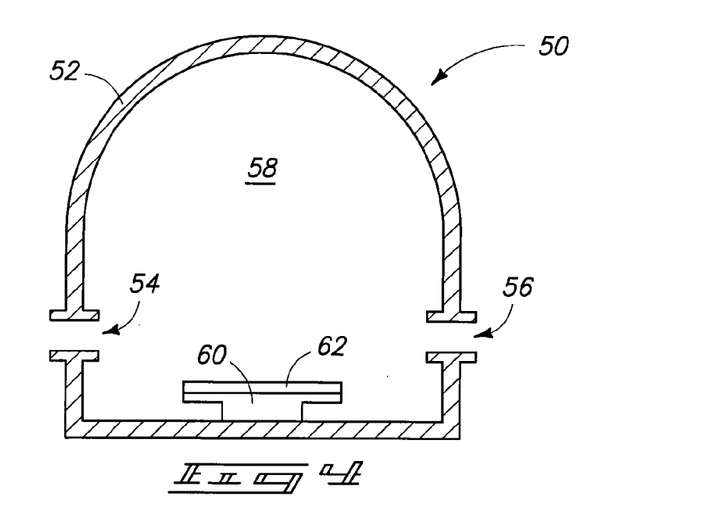
FIG. 4 is a cross-sectional, diagrammatic side view of an example reaction chamber that may be used in some embodiments.

An example reaction chamber that may be utilized for the process of FIG. 1 is shown in FIG. 4 as part of an apparatus 50. The apparatus comprises a sidewall 52 having openings 54 and 56 extending therethrough, and having a chamber 58 contained therein. A substrate holder 60 is within the chamber, and supports a substrate 62. In operation, precursors are flowed into the chamber through one or both of openings 54 and 56; and products and unreacted materials are purged from the chamber through one or both of the openings. Valves (not shown) may be provided to control flow of materials through the openings.

The apparatus 50 may be configured so that a plasma may be maintained within chamber 58 during at least a portion of a deposition process.

The apparatus 50 may be utilized in an atomic layer deposition (ALD) process by flowing reactant materials into the chamber at substantially non-overlapping times relative to one another so that the materials only react along a surface of the substrate. Alternatively, the apparatus 50 may be utilized in a chemical vapor deposition (CVD) process by flowing multiple reactant materials into the chamber simultaneously so that the materials react within the chamber above a surface of the substrate to form a material which deposits across the substrate surface.

Figure 2:
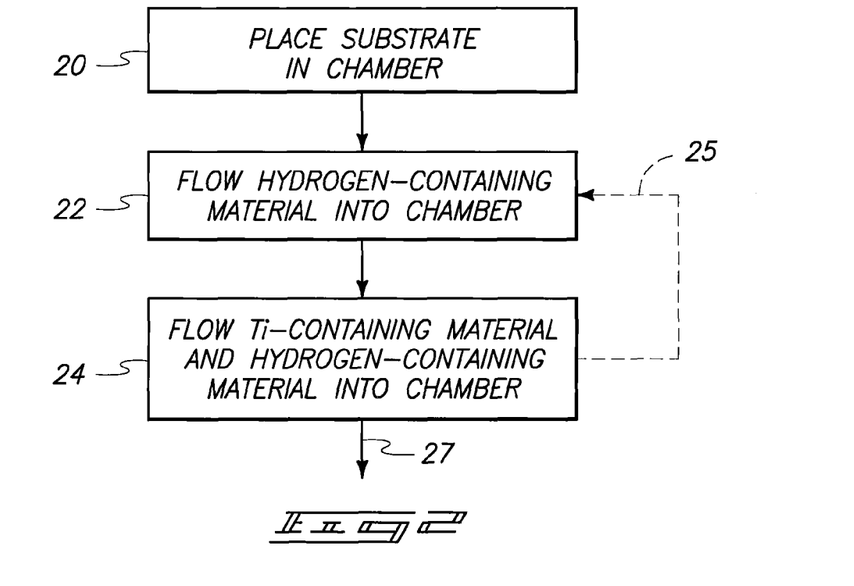
FIG. 2 is a flow chart diagram of an embodiment.
Figure 3:
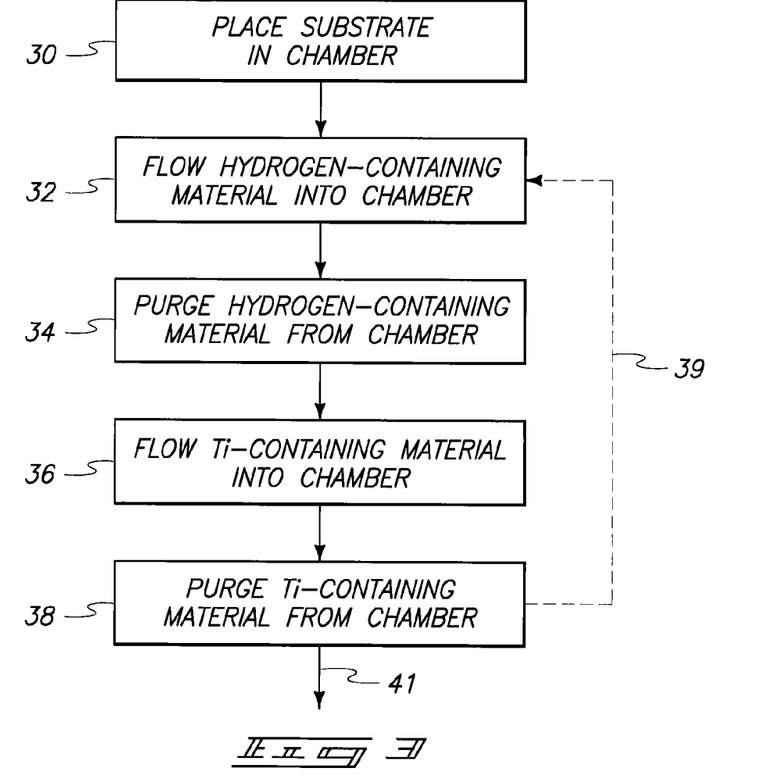
FIG. 3 is a flow chart diagram of an embodiment.

As discussed above, the flow chart diagram of FIG. 1 is generic to either the 2-step process or the 3-step process. FIGS. 2 and 3 show flow chart diagrams more specifically directed toward the 2-step process (FIG. 2) and the 3-step process (FIG. 3).

Referring to FIG. 2, the illustrated process begins by placing a substrate within a chamber (step 20). The substrate may be a semiconductor substrate comprising an exposed surface containing a region of a semiconductor material, and also containing a region of an insulative material. The chamber may be of the type diagrammatically illustrated in FIG. 4.

Hydrogen-containing material is flowed into the chamber at step 22. Such hydrogen-containing material may be $H_2$ and/or hydrocarbon flowed into the chamber with argon carrier gas, and may be within the chamber together with a plasma. Step 22 may be considered a pre-deposition treatment of at least some of the substrate surface. In some embodiments, such pre-deposition treatment may utilize a hydrogen-containing material consisting of $H_2$, with such hydrogen-containing material being flowed into the chamber at a flow rate of from about 5 standard cubic centimeters per minute (sccm) to about 5000 sccm, utilizing an argon carrier gas. The treatment may be conducted while a temperature of the substrate surface is from about 200° C. to about 800° C., and while a plasma is maintained in the reaction chamber.

Next, titanium-containing material and hydrogen-containing material are simultaneously flowed into the reaction chamber at step 24. The hydrogen-containing material utilized at step 24 may be the same as, or different from, that utilized in step 22. The hydrogen-containing material utilized in step 24 may, for example, comprise, consist essentially of, or consist of one or more of $H_2$, organic materials, or hydrocarbons (for instance, methane, ethane, ethylene, etc.); and the titanium-containing material may comprise, consist essentially of, or consist of one or more of $TiCl_4$ and various organometallic compounds (for example, TDMAT or TDEAT). If the titanium-containing material is an organometallic material (for instance, TDMAT or TDEAT), hydrogen-containing material introduced into chamber with the titanium-containing material may be solely from the organic component of the organometallic material, or may be from $H_2$ and/or hydrocarbon introduced into the chamber with the organometallic material.

A plasma may be utilized in the reaction chamber during step 24. In an example embodiment, $H_2$ and $TiCl_4$ are flowed into the chamber with argon carrier gas, and a plasma is maintained within the chamber. The $H_2$ is flowed into the chamber at a flow rate of from about 5 sccm to about 5000 sccm, and the $TiCl_4$ is flowed into the chamber at a flow rate of from about 0.5 mg/minute to about 500 mg/minute. A temperature of the substrate surface may be from about 400° C. to about 800° C.

Steps 22 and 24 may be together considered an iteration utilized to form a titanium-containing film or layer across the substrate surface. Such iteration may be repeated multiple times (as diagrammatically illustrated by dashed line 25) to form a titanium-containing mass to a desired thickness.

Eventually, the processing continues to other steps (such as removal of the substrate from the chamber), with the progression to such other steps being indicated by arrow 27.

The hydrogen pre-treatment of step 22 may improve uniformity of formation of a titanium-containing layer at a subsequent step 24 by incorporating hydrogen into semiconductor surfaces. The step 24 may be at least partially a CVD-type process in which the hydrogen-containing material and titanium-containing material react in the chamber to form a titanium-containing deposit that falls on the substrate, and/or may be at least partially an ALD-type process in which titanium-containing material reacts only along a surface of the substrate to form a titanium-containing deposit across the substrate surface. In some embodiments, the titanium-containing layer formed at step 24 may have a different composition along one substrate surface than along another. For instance, if a first of the surfaces consists of silicon and a second of the surfaces is silicon dioxide, the portion of the titanium-containing layer formed along the first surface may be titanium silicide while that formed along the second surface may consist of titanium. Regardless, the titanium-containing layer may be uniform across both the first and second surfaces in thickness and/or continuity.

Referring to FIG. 3, the illustrated 3-step process begins by placing a substrate within a chamber (step 30). The substrate may be a semiconductor substrate comprising an exposed surface containing a region of a semiconductor material, and also containing a region of an insulative material. The chamber may be of the type diagrammatically illustrated in FIG. 4.

Hydrogen-containing material is flowed into the chamber at step 32. Such hydrogen-containing material may be $H_2$ and/or hydrocarbon flowed into the chamber with argon carrier gas, and may be within the chamber together with a plasma. Step 32 may be considered a pre-deposition treatment of at least some of the substrate surface, or an activation of at least some of the substrate surface. Such activation may specifically be utilized to incorporated hydrogen into a portion of the surface comprising semiconductor materials (with exemplary semiconductor materials being silicon and germanium, which may be conductively-doped in some embodiments). In some embodiments, such treatment may utilize a hydrogen-containing material consisting of $H_2$, with such hydrogen-containing material being flowed into the chamber at a flow rate of from about 5 sccm to about 5000 sccm, utilizing an argon carrier gas. The treatment may be conducted while a temperature of the substrate surface is from about 200° C. to about 800° C., and while a plasma is maintained in the reaction chamber.

The hydrogen-containing material is purged from the reaction chamber at step 34. Such purge may utilize vacuum and/or a purge gas (for example, argon).

Next, titanium-containing material is flowed into the reaction chamber at step 36. The titanium-containing material may comprise, consist essentially of, or consist of one or more of $TiCl_4$ and various organometallic compounds (for example, TDMAT or TDEAT). If the titanium-containing material is an organometallic material (for instance, TDMAT or TDEAT), any hydrogen-containing material introduced into chamber with the titanium-containing material is solely from the organic component of the organometallic material. If the titanium-containing material is $TiCl_4$, such may be flowed into the chamber in the absence of hydrogen.

A plasma may be utilized in the reaction chamber during step 24. In an example embodiment, $TiCl_4$ is flowed into the chamber with argon carrier gas, and a plasma is not maintained within the chamber. The $TiCl_4$ is flowed into the chamber at a flow rate of from about 0.5 mg/minute to about 500 mg/minute. A temperature of the substrate surface may be from about 400° C. to about 800° C.

The titanium-containing material is purged from the reaction chamber at step 38. Such purge may utilize vacuum and/or a purge gas (for example, argon).

Steps 32, 34, 36 and 38 may be together considered an iteration utilized to form a titanium-containing film or layer (with steps 32, 34 and 36 being the three steps of the 3-step process). Such iteration may be repeated multiple times (as diagrammatically illustrated by dashed line 39) to form a titanium-containing mass to a desired thickness.

Eventually, the processing continues to other steps (such as removal of the substrate from the chamber), with the progression to such other steps being indicated by arrow 41.

The substrate exposed to the process of FIG. 3 may have a surface comprising semiconductor material in one region, and comprising insulative material in another region, and the process may be utilized to selectively form a titanium-containing layer across the semiconductor material while not forming titanium across the insulative material. For instance, the semiconductor material may comprise, consist essentially of, or consist of silicon or conductively-doped silicon, the insulative material may comprise one or more of an oxide, nitride and oxynitride, and the process of FIG. 3 may form titanium silicide from the silicon-containing surface while not depositing titanium on the insulative surface. The titanium silicide may be $TiSi_x$; where x is 2 in some embodiments, less than 2 in other embodiments in which the silicide is enriched in titanium, and more than 2 in yet other embodiments in which the silicide is enriched in silicon. In yet other embodiments, the material formed may be a stack of $Ti/TiSi_x$ in ascending order from the substrate, or a stack of $TiSi_x/Ti$ in ascending order from the substrate.

The steps 32, 34, 36 and 38 may be an ALD-type process in which hydrogen activates semiconductor material, the hydrogen is then purged from a reaction chamber, and titanium-containing material then reacts with the activated semiconductor material. Such reaction may form titanium silicide. In subsequent iterations of steps 32, 34, 36 and 38 the hydrogen activates silicon either of the titanium silicide, or of the substrate underlying the titanium silicide and accessible through the titanium silicide; and the titanium-containing material then reacts with such activated silicon.

FIGS. 5-9 illustrate an exemplary application for the selective titanium deposition of the FIG. 3 process.

Figure 5:
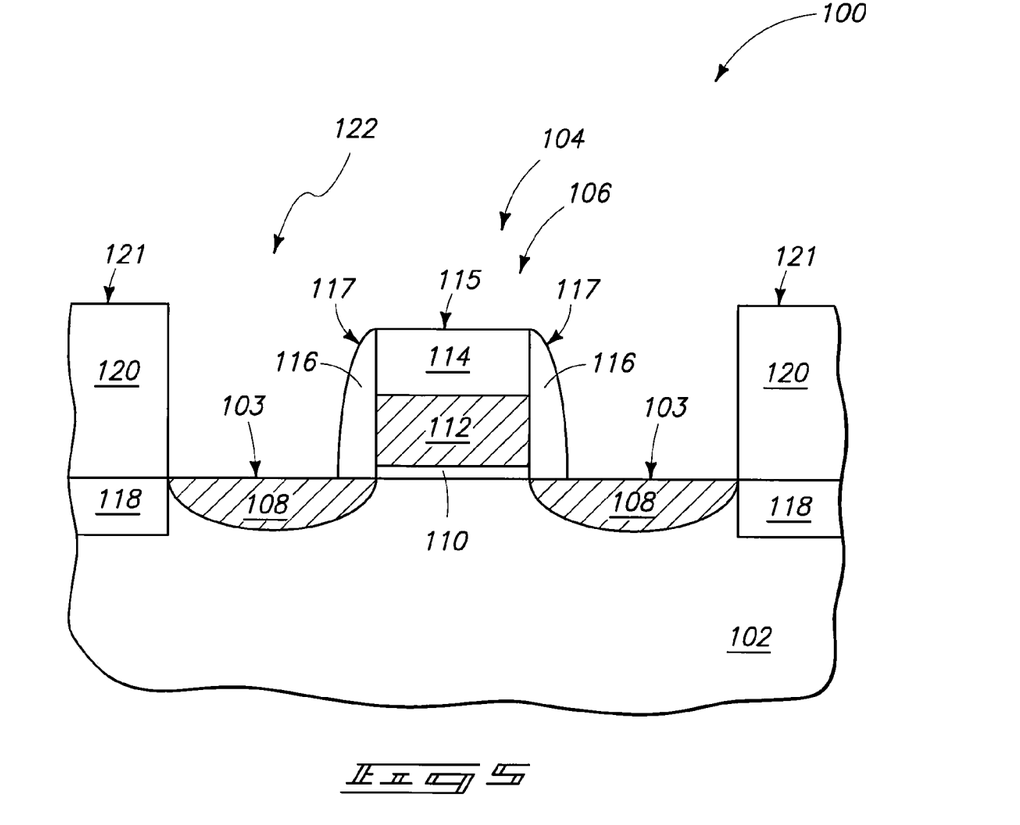
FIGS. 5-9 are diagrammatic, cross-sectional side views illustrating processing stages of an embodiment.

Referring to FIG. 5, a portion of a semiconductor construction 100 is illustrated. The construction 100 comprises a semiconductor base 102 (which may also be referred to as a semiconductor substrate). The base may comprise any of various semiconductor materials including, for example, one or both of silicon and germanium. For instance, the base may comprise monocrystalline silicon.

A transistor 104 is supported by the base. The transistor includes a gate stack 106 over base 102, and includes a pair of source/drain regions 108 extending into the base 102.

The gate stack 106 comprises gate dielectric 110, electrically conductive gate material 112, and an electrically insulative capping layer 114. The gate dielectric 110 may comprise any suitable electrically insulative composition or combination of compositions, and may, for example, comprise, consist essentially of, or consist of silicon dioxide. The electrically conductive gate material 112 may comprise any suitable composition or combination of compositions, and may, for example, comprise, consist essentially of, or consist of one or more of various metals (for instance, titanium or tungsten), metal-containing compositions (for instance, metal nitride or metal silicides) and conductively-doped semiconductor materials (for instance, conductively-doped silicon). The electrically insulative capping layer 114, comprise any suitable composition or combination of compositions, and may, for example, comprise, consist essentially of, or consist of one or more of silicon dioxide, silicon nitride and silicon oxynitride.

A pair of sidewall spacers 116 are along sidewalls of gate stack 106. The sidewall spacers may comprise any suitable composition or combination of compositions, and may, for example, comprise, consist essentially of, or consist of one or more of silicon dioxide, silicon nitride and silicon oxynitride.

The source/drain regions 108 are conductively-doped regions extending into semiconductor base 102. The source/drain regions may be either n-type majority doped or p-type majority doped.

Electrically insulative isolation regions 118 extend into base 102 proximate the source/drain regions 108. The electrically insulative isolation regions may correspond to shallow trench isolation regions, and may comprise, consist essentially of, or consist of one or both of silicon dioxide and silicon oxynitride.

A patterned electrically insulative material 120 is over base 102, and source/drain regions 108 are exposed within an opening 122 that extends through patterned electrically insulative material 120. The patterned electrically insulative material 120 may comprise any suitable composition or combination of compositions, and may, for example, comprise, consist essentially of, or consist of one or both of silicon dioxide and borophosphosilicate glass (BPSG).

Semiconductor base 102 comprises a surface 103 extending across source/drain regions 108. Such surface comprises semiconductor material of base 102 (for instance, silicon), and in the shown embodiment consists of conductively-doped semiconductor material (for instance, conductively-doped silicon). Electrically insulative materials 114, 116 and 120 comprise outermost electrically insulative surfaces 115, 117 and 121, respectively. Such surfaces may, for example, comprise, consist essentially of, or consist of one or more of various oxides, nitrides and oxynitrides; and for instance may comprise, consist essentially of, or consist of one or more of silicon dioxide, silicon nitride and silicon oxynitride.

Figure 6:
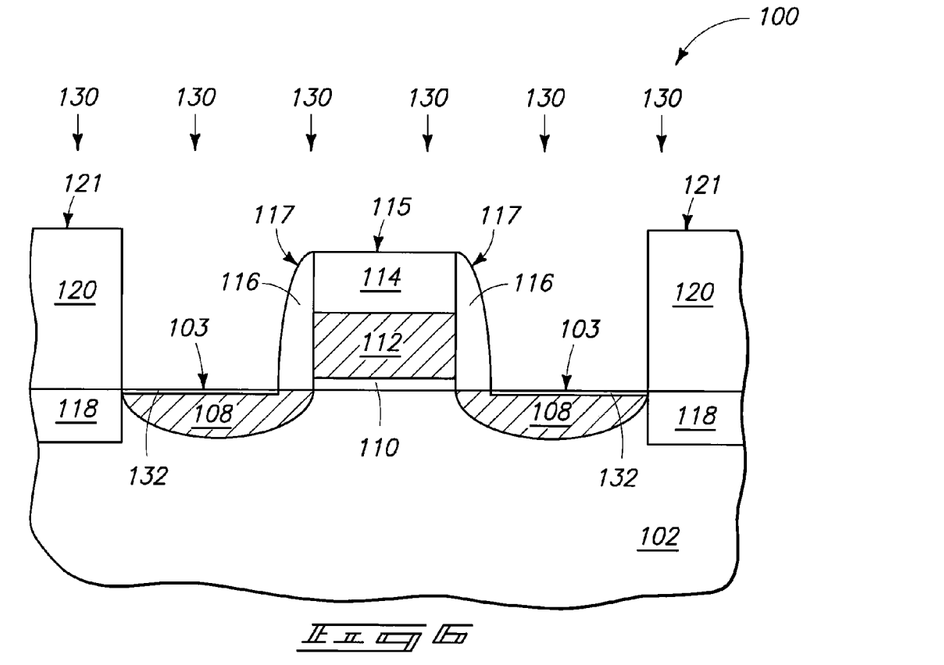

Referring to FIG. 6, construction 100 is exposed to hydrogen-containing material 130, in processing corresponding to the step 32 of FIG. 3. Such may be accomplished in a reaction chamber, as discussed above with reference to FIG. 3. The exposure to the hydrogen-containing material activates semiconductor-containing material of surfaces 103 to form activated regions 132 of the semiconductor-containing material, and does not activate the surfaces of insulative materials 114, 116 and 120. The hydrogen-containing material 130 may be any of the hydrogen-containing materials discussed above with reference to FIG. 3. In some embodiments, the hydrogen-containing material may consist of hydrocarbon and/or $H_2$, and may be plasma-activated during the processing of FIG. 6. If the hydrogen-containing material includes hydrocarbon, carbon may be incorporated into the activated regions 132. Such incorporation of carbon may be advantageous in some embodiments. In other embodiments it may be desired to use hydrogen-containing material consisting of $H_2$ in order to avoid carbon incorporation in the activated regions of the semiconductor material.

After formation of activated regions 132, the hydrogen-containing material is purged from within the reaction chamber in processing corresponding to step 34 of FIG. 3. Subsequently, titanium-containing material is flowed into the reaction chamber in a step corresponding to step 36 of FIG. 3. Such step is diagrammatically illustrated in FIG. 7, with the titanium-containing material being shown as a material 134 flowed across construction 100. The titanium-containing material 134 may comprise any of the materials discussed with reference to FIG. 3. Accordingly, titanium-containing material 134 may comprise $TiCl_4$ in some embodiments; and in alternative embodiments may comprise organometallic material, either alone, or in addition to $TiCl_4$. The titanium-containing material may be plasma-activated in some embodiments, and in other embodiments is not plasma-activated.

Figure 7:
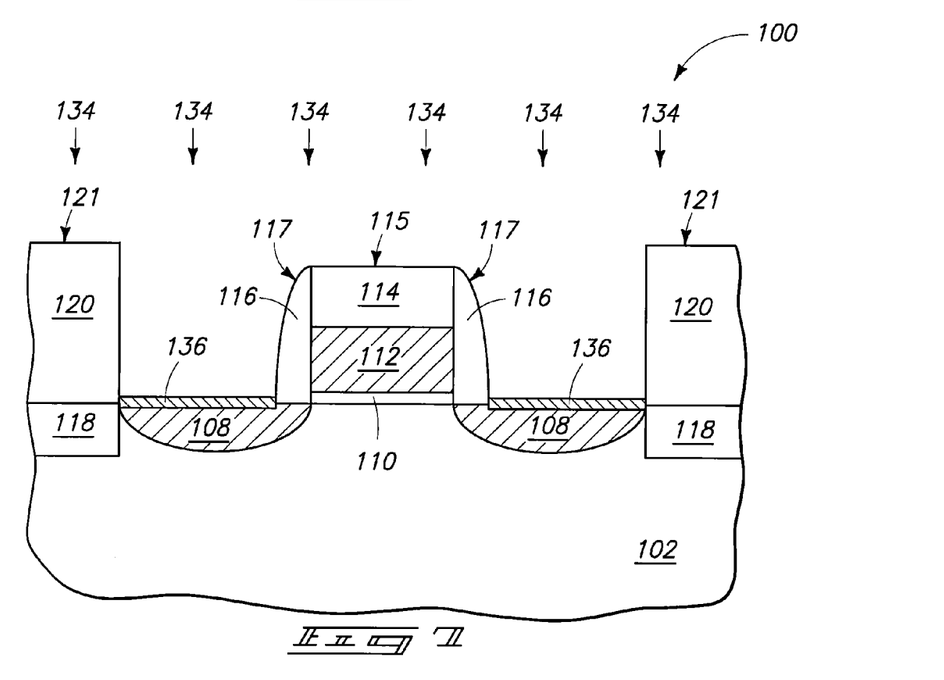

The exposure to titanium-containing material 134 forms titanium-containing layers 136 across the activated regions 132 (FIG. 6), and specifically across exposed upper surfaces of source/drain regions 108. Notably, titanium is selectively formed across surfaces containing semiconductor material relative to surfaces containing insulative material, and in the shown embodiment such selectivity is absolute in that no titanium is formed across the insulative material surfaces during formation of the titanium across the semiconductor surfaces. In other embodiments, the selectivity may not be absolute, but more titanium will be formed across the semiconductor surfaces than across the insulative material surfaces.

The titanium-containing layers 136 may comprise compositions containing titanium from the titanium-containing material 134 incorporated with semiconductor material from base 102. For instance, if base 102 comprises silicon, the titanium-containing layers 136 may comprise, consist essentially of, or consist of titanium silicide.

After formation of titanium-containing layers 136, the titanium-containing material may be purged from a reaction chamber in processing corresponding to step 38 of FIG. 3. The titanium-containing layers 136 may be formed to a desired thickness by repeating iterations of steps 32, 34, 36 and 38 of FIG. 3, as discussed above.

Figure 8:
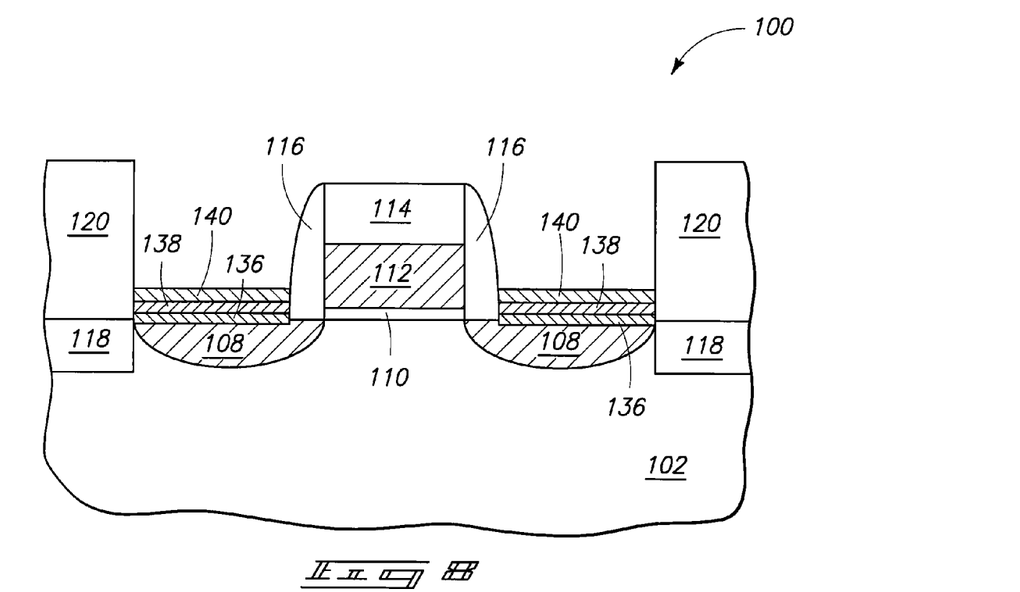

Referring to FIG. 8, electrically conductive capping layers 138 and 140 are formed over titanium-containing layer 136. In some embodiments, titanium-containing layer 136 consists of titanium silicide, and capping layers 138 and 140 are nitride-containing caps provided to protect the silicide from oxidation. Layers 138 and 140 may be formed in the same reaction chamber utilized to form layer 136, and may correspond to mixed titanium silicide and nitride (i.e., $TiSi_xN_y$) and titanium nitride (i.e., $TiN_z$), respectively. The layers 138 and 140 may be formed by conventional methods, including one or both of ALD and CVD.

Figure 9:
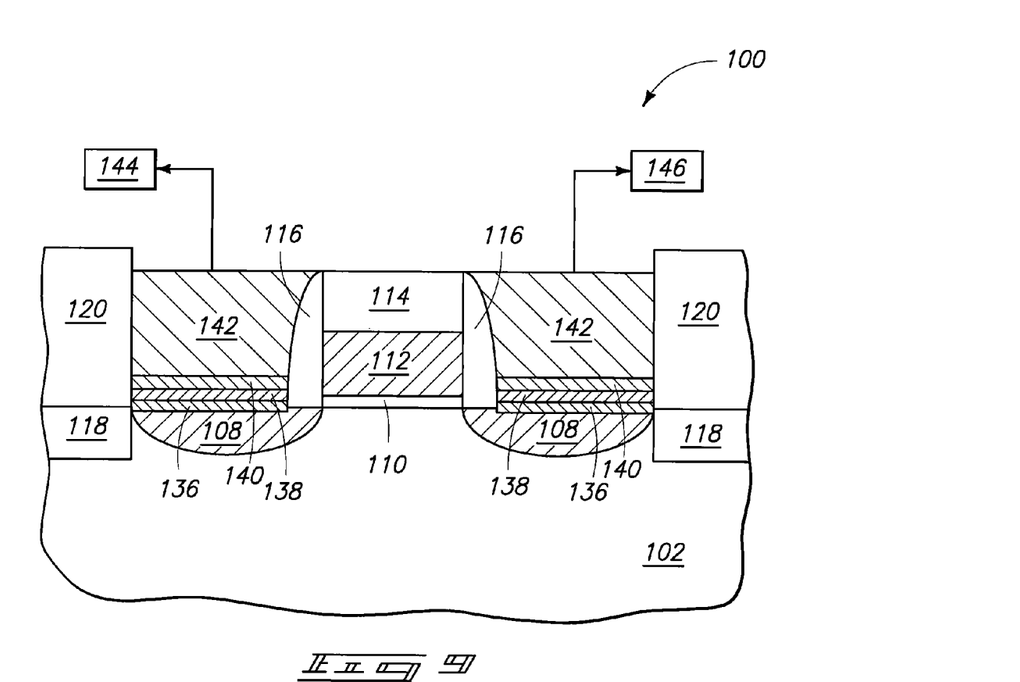

Referring to FIG. 9, electrically conductive structures (pedestals) 142 are formed over and in electrical connection with electrically conductive layer 140. Electrically conductive pedestals 142 may comprise any suitable electrically conductive composition or combination of compositions, and may, for example, comprise, consist essentially of, or consist of one or more of various metals (for instance, titanium or tungsten), metal-containing compositions (for instance, metal nitride or metal silicides) and conductively-doped semiconductor materials (for instance, conductively-doped silicon). One of the electrically conductive pedestals may be in electrical contact with a bitline 144, and the other may be in electrical contact with a capacitor 146. Accordingly, the shown construction of FIG. 9 may be incorporated into a dynamic random access memory (DRAM) unit cell.

The application of FIGS. 5-9 is but one of many applications in which the processing sequence of FIG. 3 may be utilized for selective formation of silicide in a desired region relative to other regions. Additionally, titanium silicide is an example composition that may be formed utilizing the processing sequence of FIG. 3, and other titanium-containing compositions may be formed in other embodiments (for instance, the titanium-containing compound will contain titanium and germanium in embodiments in which the semiconductor is germanium instead of silicon).

FIGS. 10-13 illustrate another application for utilizing the processing sequence of FIG. 3 to selectively form a titanium-containing composition across one region of a substrate surface relative to another region of the substrate surface.

Figure 10:
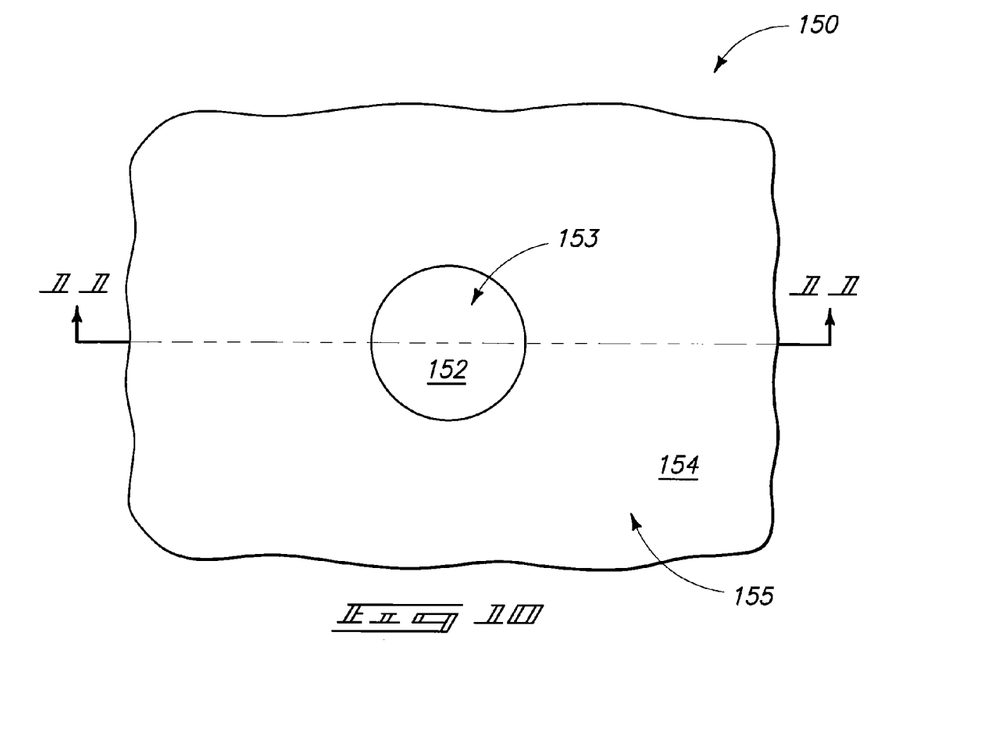
FIGS. 10 and 11 are a diagrammatic top view and cross-sectional side view, respectively, of a semiconductor construction at a processing stage of an embodiment.
Figure 11:
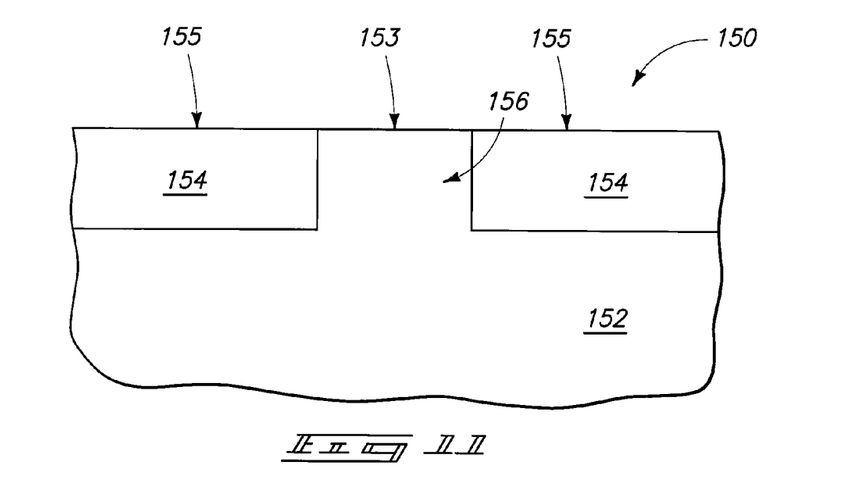

FIGS. 10 and 11 illustrate a semiconductor substrate 150 comprising a semiconductor base 152 and insulative material regions 154 supported by the base. The insulative material regions may be isolation regions. The semiconductor material of the base comprises a pedestal (or mesa) 156 extending upwardly between the insulative material regions 154. The semiconductor material 152 comprises an uppermost surface 153 extending across pedestal 156, and the insulative material regions 154 comprise uppermost surfaces 155. The top view of FIG. 10 shows the surface 153 to be an island surrounded by insulative material surface 155. The surface regions 153 and 155 together are comprised by a surface of substrate 150.

The semiconductor material 152 may comprise one or both of silicon and germanium; and accordingly surface 153 may comprise, consist essentially of, or consist of one or both of silicon and germanium. Insulative material 154 may comprise one or more compositions selected from the group consisting of oxides, nitrides and oxynitrides; and may, for example, comprise, consist essentially of, or consist of one or more of silicon dioxide, silicon nitride and silicon oxynitride.

Figure 12:
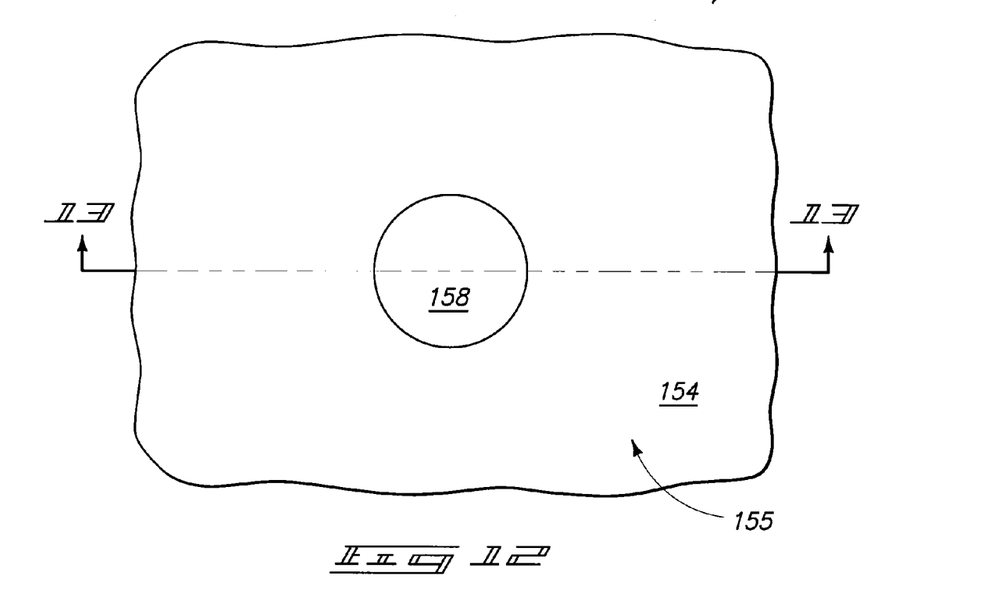
FIGS. 12 and 13 are a diagrammatic top view and cross-sectional side view, respectively, of the semiconductor construction of FIGS. 10 and 11, shown at a processing stage subsequent to that of FIGS. 10 and 11.
Figure 13:
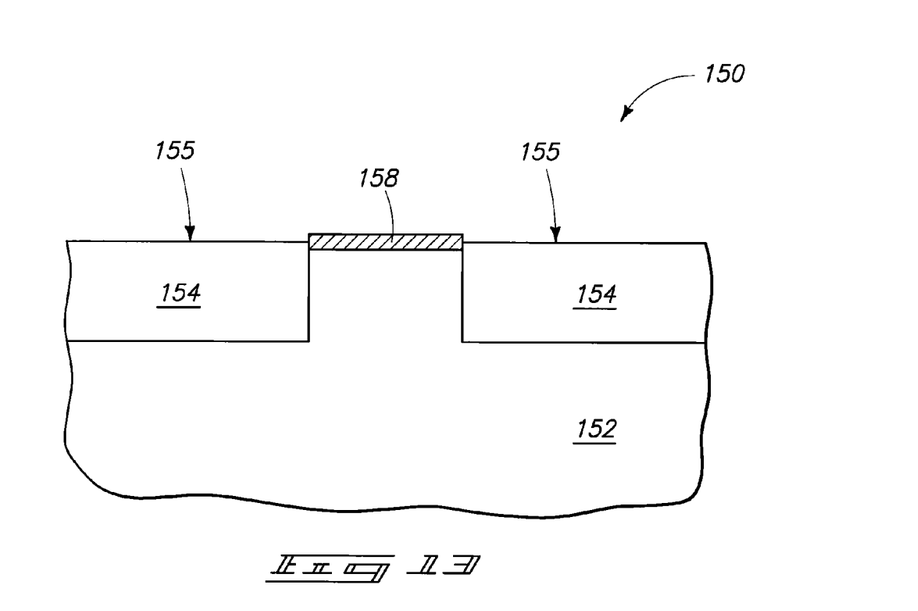

Referring to FIGS. 12 and 13, substrate 150 is shown after exposure to the processing sequence of FIG. 3; and specifically is shown after selective formation of a titanium-containing layer 158 across the upper surface 153 (FIGS. 10 and 11) of semiconductor material 152 relative to the upper surface 155 of insulative material 154. Titanium-containing layer 158 may, for example, comprise titanium silicide in embodiments in which base 152 comprises silicon.

FIGS. 14-17 illustrate another application for utilizing a processing sequence of FIG. 3 to selectively form a titanium-containing composition across one region of a substrate surface relative to another region of the substrate surface.

Figure 14:
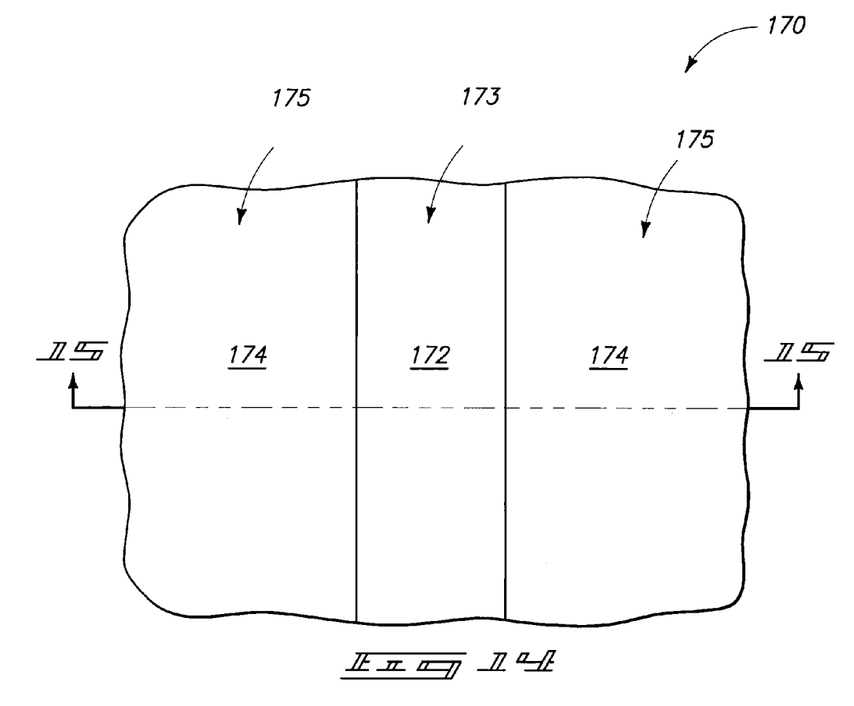
FIGS. 14 and 15 are a diagrammatic top view and cross-sectional side view, respectively, of a semiconductor construction at a processing stage of an embodiment.
Figure 15:
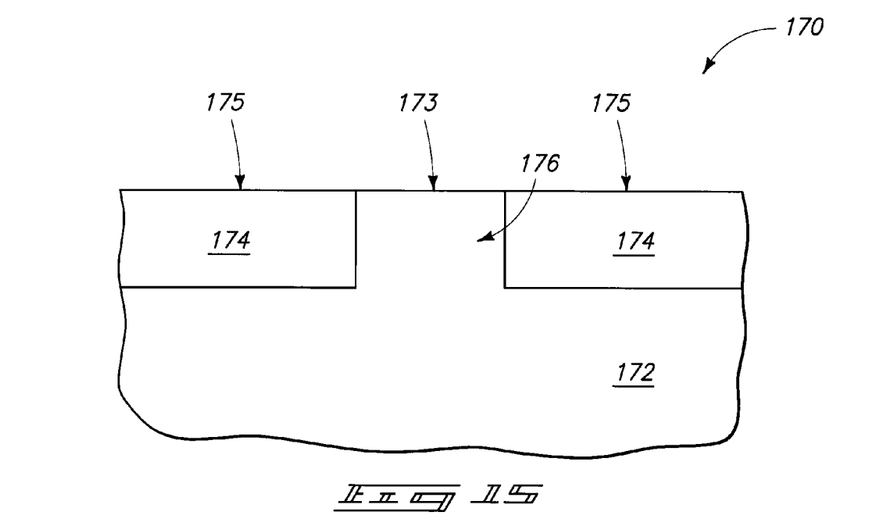

FIGS. 14 and 15 illustrate a semiconductor substrate 170 comprising a semiconductor base 172 and insulative material regions 174 supported by the base. The insulative material regions may be isolation regions. The semiconductor material of the base comprises a pedestal (or mesa) 176 extending upwardly between the insulative material regions 174. The semiconductor material 172 comprises an uppermost surface 173 extending across pedestal 176, and the insulative material regions 174 comprise uppermost surfaces 175. The top view of FIG. 14 shows the surface 173 to be a line extending across a portion of the substrate. The surface regions 173 and 175 together are comprised by a surface of substrate 170.

The semiconductor material 172 may comprise one or both of silicon and germanium; and accordingly surface 173 may comprise, consist essentially of, or consist of one or both of silicon and germanium. Insulative material 174 may comprise one or more compositions selected from the group consisting of oxides, nitrides and oxynitrides; and may, for example, comprise, consist essentially of, or consist of one or more of silicon dioxide, silicon nitride and silicon oxynitride.

Figure 16:
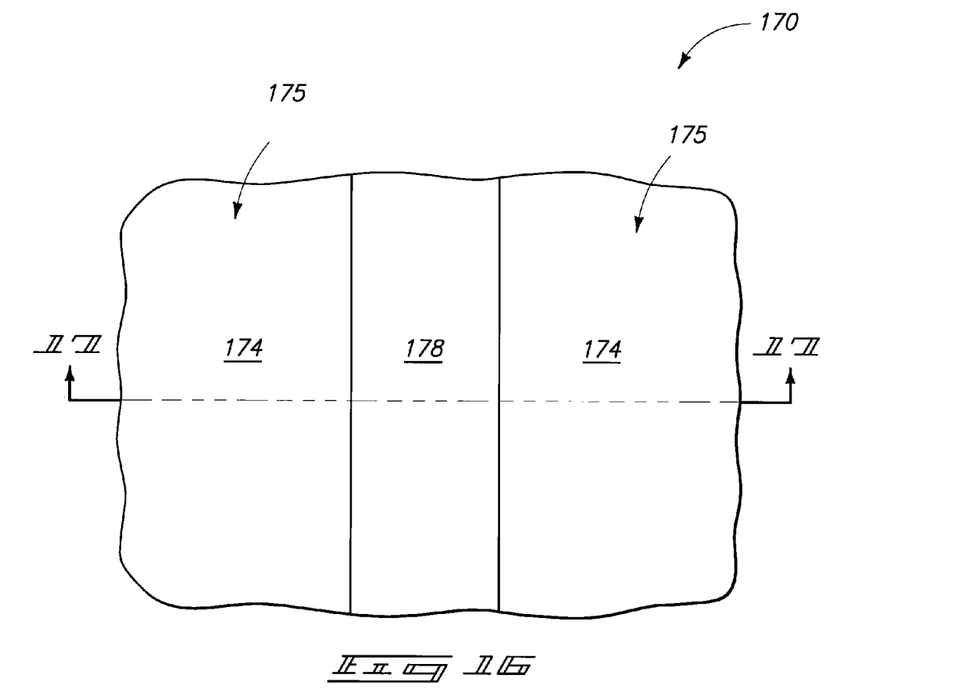
FIGS. 16 and 17 are a diagrammatic top view and cross-sectional side view, respectively, of the semiconductor construction of FIGS. 14 and 15, shown at a processing stage subsequent to that of FIGS. 14 and 15.
Figure 17:
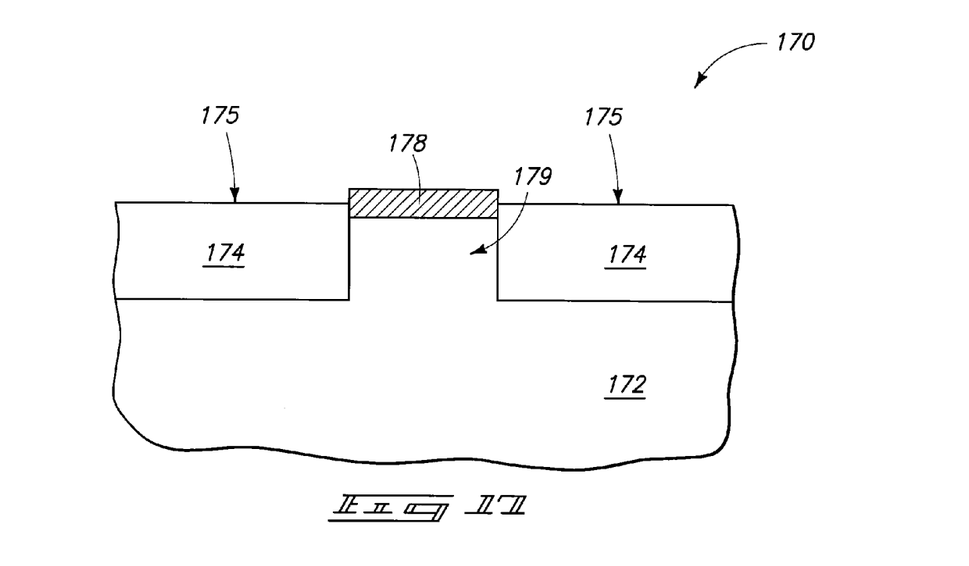

Referring to FIGS. 16 and 17, substrate 170 is shown after exposure to the processing sequence of FIG. 3; and specifically is shown after selective formation of a titanium-containing layer 178 across the upper surface 173 (FIGS. 14 and 15) of semiconductor material 172 relative to the upper surface 175 of insulative material 174. Titanium-containing layer 178 may, for example, comprise titanium silicide in embodiments in which base 172 comprises silicon.

FIGS. 14-17 are one embodiment application for forming a titanium-containing composition selectively over a surface of a semiconductor material line relative to insulative material surfaces. Other embodiments may include applications in which wordlines are fabricated to comprise conductively-doped semiconductor material.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:
1. A method of titanium deposition, comprising:
    placing a substrate in a chamber;
    flowing hydrogen-containing material into the chamber and exposing a surface of the substrate to hydrogen of the hydrogen-containing material;
    flowing titanium-containing material into the chamber to deposit titanium on the surface; and
    wherein the hydrogen-containing material is flowed into the chamber prior to the flowing of the titanium-containing material, wherein the hydrogen-containing material is flowed into the chamber in the absence of any titanium being flowed into the chamber, and wherein the titanium is flowed into the chamber in the absence of any hydrogen being flowed into the chamber.
2. The method of claim 1 wherein the hydrogen-containing material comprises $H_2$.
3. The method of claim 2 wherein the $H_2$ is flowed into a plasma in the chamber.
4. The method of claim 1 wherein the hydrogen-containing material comprises one or more organic materials.
5. The method of claim 1 wherein the hydrogen-containing material comprises one or more hydrocarbons.
6. A method of titanium deposition, comprising:
    placing a substrate in a chamber;
    flowing hydrogen-containing material into the chamber and exposing a surface of the substrate to hydrogen of the hydrogen-containing material;
    flowing titanium-containing material into the chamber to deposit titanium on the surface;
    wherein the hydrogen-containing material is flowed into the chamber prior to the flowing of the titanium-containing material;
    wherein the hydrogen-containing material is flowed into the chamber in the absence of any titanium being flowed into the chamber;
    wherein the hydrogen-containing material is removed from within the chamber prior to the flowing of the titanium-containing material; and
    wherein any hydrogen flowed into the chamber with the titanium-containing material is contained by the titanium-containing material.
7. A method of titanium deposition, comprising the following steps in the following sequence:
    placing a substrate in a chamber, the substrate comprising a semiconductor-containing surface and an electrically insulative surface;
    flowing hydrogen-containing material into the chamber and exposing the semiconductor-containing and electrically insulative surfaces of the substrate to hydrogen of the hydrogen-containing material;
    removing all of the hydrogen-containing material from the chamber; and
    while there is no hydrogen-containing material within the chamber, flowing titanium-containing material into the chamber to selectively deposit titanium over the semiconductor-containing surface and not over the electrically insulative surface.

8. A method of titanium deposition, comprising:
placing a monocrystalline silicon-containing substrate in a chamber;
flowing hydrogen-containing material into the chamber and exposing a surface of the substrate to hydrogen of the hydrogen-containing material;
flowing titanium-containing material into the chamber to deposit titanium on the surface;
wherein the hydrogen-containing material is flowed into the chamber prior to the flowing of the titanium-containing material;
wherein the hydrogen-containing material is flowed into the chamber in the absence of any titanium being flowed into the chamber;
wherein the hydrogen-containing material is a first hydrogen-containing material;
wherein a second hydrogen-containing material is flowed into the chamber with the titanium-containing material; and
wherein the first hydrogen-containing material is different in composition from the second hydrogen-containing material.

9. The method of claim 8 wherein the substrate surface comprises an insulative portion and a semiconductor portion, and wherein a film of the titanium is deposited uniformly across both of said portions of the surface.

10. The method of claim 9 wherein the insulative portion comprises one or more of aluminum oxide, hafnium oxide, silicon dioxide, silicon nitride and silicon oxynitride; and wherein the semiconductor portion comprises one or both of silicon and germanium.

* * * * *

UNITED STATES PATENT AND TRADEMARK OFFICE
CERTIFICATE OF CORRECTION

| | | |
|---|---|---|
| PATENT NO. | : 7,947,597 B2 | Page 1 of 1 |
| APPLICATION NO. | : 12/720562 | |
| DATED | : May 24, 2011 | |
| INVENTOR(S) | : Joel A. Drewes et al. | |

It is certified that error appears in the above-identified patent and that said Letters Patent is hereby corrected as shown below:

In column 1, line 2, below "DEPOSITION" insert -- RELATED PATENT DATA --.

Signed and Sealed this
Fifth Day of July, 2011

David J. Kappos
*Director of the United States Patent and Trademark Office*